(12) United States Patent
Ruckerbauer et al.

(10) Patent No.: US 6,819,625 B2
(45) Date of Patent: Nov. 16, 2004

(54) MEMORY DEVICE

(75) Inventors: Hermann Ruckerbauer, Moss (DE); Andre Schäfer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/266,353

(22) Filed: Oct. 7, 2002

(65) Prior Publication Data

US 2003/0067835 A1 Apr. 10, 2003

(30) Foreign Application Priority Data

Oct. 5, 2001 (DE) .......................................... 101 49 031

(51) Int. Cl.⁷ ................................................ G11C 7/00
(52) U.S. Cl. .................. 365/233; 365/189.01; 365/191; 365/194
(58) Field of Search ................................ 365/233, 194, 365/191, 189.01

(56) References Cited

U.S. PATENT DOCUMENTS

| | | | |
|---|---|---|---|
| 5,790,447 A | 8/1998 | Laudon et al. ................. 365/52 |
| 6,115,318 A * | 9/2000 | Keeth .......................... 365/233 |
| 6,359,815 B1 | 3/2002 | Sato et al. .................... 365/198 |
| 6,445,624 B1 * | 9/2002 | Janzen et al. ................ 365/191 |
| 6,456,544 B1 * | 9/2002 | Zumkehr ...................... 365/193 |

FOREIGN PATENT DOCUMENTS

WO  WO 99/46687  9/1999

* cited by examiner

Primary Examiner—Richard Elms
Assistant Examiner—Pho M. Luu
(74) Attorney, Agent, or Firm—Laurence A. Greenberg; Werner H. Stemer; Ralph E. Locher

(57) ABSTRACT

A memory device has a memory module, a controller, a data bus for connecting the controller and the memory module, a read clock generator, and a read clock bus for connecting the read clock generator, the memory module, and the Controller. The data bus read data from the memory module or writes data into the memory module. The read clock generator is disposed in the memory module, so that the data bus and the read clock bus are substantially symmetric, and generate a read clock for transferring data from the memory module to the controller. The data bus and the read clock bus are configured with respect to each other such that substantially no time delay between read data on the data bus and the read clock on the read clock bus exists at the controller.

5 Claims, 4 Drawing Sheets

MEMORY DEVICE

BACKGROUND OF THE INVENTION

1. Field of the Invention

The present invention refers to a memory device, and particularly to a memory device with a data stub bus topology (DQ stub bus topology).

2. Description of the Related Art

In the following, an example for a prior art memory device with a data stub bus topology will be discussed in more detail with reference to FIG. 1. In the example shown in FIG. 1, the memory device comprises a first memory module 100 and a second memory module 102. The illustrated memory modules 100 and 102 are, for example, DIMMs (DIMM=Dual Inline Memory Module). The two memory elements 104 and 106, for example DRAMs, are shown exemplarily in FIG. 1, arranged in the first memory module 100. Further, as example, two memory elements 108 and 110, such as also DRAMs of the second memory module 102 are shown.

The memory device further comprises a controller 112, by which reading in/reading out of data to/from the memory elements 104 to 110 of the memory modules 100 and 102 is controlled. Therefore, the controller 112 is coupled to further elements of a data processing means via connections, not shown in FIG. 1, initiating access to one or several of the memory elements. Further, the memory device comprises means 114 for providing a read clock (read clock generator), connected to further elements, such as a phase lock loop providing the requested signals for generating and providing the read clock, respectively, via a connection, also not shown in FIG. 1.

The memory modules 100, 102, the controller 112 and means 114 are connected via bus systems for data exchange and data transfer, respectively, that will be described in more detail below.

In the illustrated embodiment, the memory device according to FIG. 1 comprises a data bus (DQ) comprising a first sub-data bus 116 and a second sub-data bus 118. The first sub-data bus 116 comprises a first portion 116a extending from the controller 112 to a branch 116b. A second portion 116c of the first sub-data bus 116 extends from the branch 116b to the memory element 104 in the first memory module 100. A third portion 116d of the first sub-data bus 116 extends from the branch 116b to the first memory element 108 in the second memory module 102. The second sub-data bus 118 comprises a first portion 118a extending from the controller 112 to a branch 118b. A second portion 118c of the first sub-data bus 118 extends from the branch 118b to the second memory element 106 in the first memory module 100. A third portion 118d of the second sub-data bus 118 extends from the branch 118b to the second memory element 110 in the second memory module 102.

Further, a read clock bus is provided, comprising a first sub-read clock bus 120 and a second sub-read clock bus 122. As can be seen in FIG. 1, a first portion 120a of the first sub-read clock bus 120 extends from the controller 112 to a first branch 120b. A second portion 120c of the first sub-read clock bus 120 extends from the branch 120b to the first memory element 104 in the first memory module 100. A third portion 120d of the first sub-read clock bus 120 extends from the first branch 120b to a second branch 120e. A fourth portion 120f of the first sub-read clock bus 120 extends from the second branch 120e to the first memory element 106 in the second memory module 102. A fifth portion 120g of the first sub-read clock bus 120 extends from the second branch 120e to the read clock generator 114. A first portion 122a of the second sub-read clock bus 122 extends from the controller 112 to a first branch 122b. A second portion 122c of the second sub-read clock bus 122 extends from the branch 122b to the second memory element 106 in the first memory module 100. A third portion 122d of the second sub-read clock bus 122 extends from the first branch 122b to a second branch 122e. A fourth portion 122f of the second sub-read clock bus 122 extends from the second branch 122e to the second memory element 110 in the second memory module 102. A fifth portion 122g of the second sub-read clock bus 122 extends from the second branch 122e to the read clock generator 114.

The mode of operation of the memory device illustrated in FIG. 1 is such that when reading data from the memory elements of the memory modules, the data will be provided on the respective data bus 116 or 118, and according to the read clock provided by the read clock generator 114 on the read clock bus 120 or 122, provided to the controller 112.

When writing data to the memory modules 100 or 102, the data to be written will be placed on the data buses 116 and 118, respectively, by the controller 112, and at the same time a write clock bus, not shown in FIG. 1, is provided, extending from the controller 112 to each of the memory elements 104 to 110. Concurrently with providing data to the data bus the respective clock signals will be provided to the write bus, so that when writing data to the memory elements 104 to 110 the data on the data bus as well as the clock signal on the write clock bus are applied substantially concurrently to a chosen memory element, i.e. between the data to be written on the data bus 116 and 118, respectively, and a write clock, no time delay can be recognized at the memory element to be written to.

The situation is different when reading data, and here, problems occur with the memory system described in FIG. 1, that are only very difficult to solve. As has been mentioned above, the read clock serves to read the data output by the memory elements into the controller. A problem is the implementation of the read clock bus in the DQ stub bus topology illustrated in FIG. 1, since here, as can easily be seen, a topology asymmetry between the topology of the data bus (DQ-bus) and the topology of the read clock buses exists, which leads to a delay between the read data and the read clock at the controller. The mentioned asymmetry is that the data bus and the read clock bus extend with different lengths through the memory system. While the buses along the portions 116a to 116d and 120a to 120f and along the portions 118a to 118d and 122a to 122f, respectively, are parallel, the read clock bus additionally comprises portions 120g and 122g, respectively, due to the necessary connection to the read clock generator 114, so that a clock signal output by the read clock generator 114 first has to pass the portions 120g and 124g, respectively, and experiences here a respective run time delay, before it enters with exactly that delay into the area of the read clock bus running in parallel to the data bus.

With reference to FIGS. 2 and 3, the problems underlying the prior art systems will be discussed in more detail. In FIG. 2, a portion of the memory system of FIG. 1 is illustrated, and here, as an example, the first memory element 108 of the second memory module 102, as well as a portion of the data bus 116 and a portion of the read clock bus 120. As is indicated by the arrows, the read clock (read_clock) is applied to the bus 120, while data (data) are read out on the bus 116 from the memory element 108, such as a DRAM.

The data read out from the memory element 108 will be sent in-phase to the read clock received at the memory element 108. If data are to be read from a memory element 108, the controller 112 initiates a respective instruction and data will be read out from the memory element according to the read clock. As can be seen from FIG. 2, data propagate from the memory element 108 via the portion 116*d* of the data bus 116 to the controller 112. Coming from the read clock generator 114, the read clock propagates via the portion 120*g* of the read clock bus 120 to the memory element 108 and concurrently to the portion 120*h* (see FIG. 2), which means further, into the direction of the controller 112. The read clock propagating to the memory element 108 initiates the readout there, does, however, need time $t_{pd}$ to reach the memory element from the node 120*e* via the portion 120*f* of the read clock bus 120. The incoming read clock initiates sending of data in the memory element 108, wherein these sent data again need time $t_{pd}$ to reach the data bus 116 from the memory element 108, so that the delay between read clock and data of $2 \times t_{pd}$ shown in FIG. 3 arises. Thus, the read clock reaches the controller 112 prior to the data, by a time period $2 \times t_{pd}$ earlier.

This delay has to be compensated by the controller 112, and solutions are known in the prior art where, due to the fact that the delay between the data signal (data) and the read clock signal (read_clock) is fixed, the controller 112 is designed to consider this delay internally. In order to ensure that, first, the occurring delay has to be detected and the whole system has to be calibrated, respectively. This procedure is, on the one hand, time intensive and expensive and, on the other hand, only secure for a short time due to the low stability of the calibration, so that the calibration procedures have to be repeated often. It is another disadvantage of this calibration procedure that it is susceptible with regard to short time interferences, such as cross talk on the data lines.

Starting from this prior art, the present invention is based on the object to provide an improved memory device where the delays between a data signal and a read clock signal in reading out the memory device will be minimized or eliminated.

SUMMERY OF THE INVENTION

The present invention is a memory device, having:

a memory module;

a controller;

a data bus connecting the controller and the memory module to read data from the memory module or write data into the memory module;

means for providing a read clock with which data are transferred from the memory module to the controller; and a read clock bus, connecting means for providing a read clock, the memory module and the controller;

wherein means for providing a read clock is disposed in the memory module, so that the data bus and the read clock bus are substantially symmetric.

The present invention is based on the knowledge that the above-described problems in connection with the run times and the occurring delay between the data signal and the read clock signal at the controller can be avoided by compensating the asymmetry between the bus topologies.

According to the invention the "global" read clock generator is omitted, and a "local" read clock generator is associated to each memory module instead. This leads to the fact, that in the inventive system, similar to a write operation in prior art systems, the read data signal propagates to the controller together with the read clock.

Due to the inventive arrangement of the read clock generators a symmetry of bus topologies arises, so that no time delay between the read data and the clock signal can be detected at the controller.

According to a preferred embodiment of the present invention, the memory module comprises a plurality of memory elements, wherein the data bus is divided into a plurality of sub-data buses and the read clock bus is divided into a plurality of sub-read clock buses, and wherein a sub-data bus and a sub-read clock bus are associated to each of the memory elements.

According to another preferred embodiment of the present invention, the memory device comprises a plurality of memory modules and a plurality of means for generating the read clock, wherein means for providing a read clock is associated to each memory module, and wherein the data bus connects the controller and the plurality of memory modules, and wherein the read clock bus connects the plurality of means for providing a read clock and the plurality of memory modules and the controller.

Preferably, the memory modules are DIMMs. Further, the memory elements preferably comprise DRAMs.

BRIEF DESCRIPTION OF THE DRAWINGS

In the following, preferred embodiments of the present invention will be discussed in more detail with reference to the accompanying drawings, in which FIG. 1 a conventional memory apparatus according to the prior art.

DESCRIPTION OF THE PREFERRED EMBODIMENTS

Figure 1:
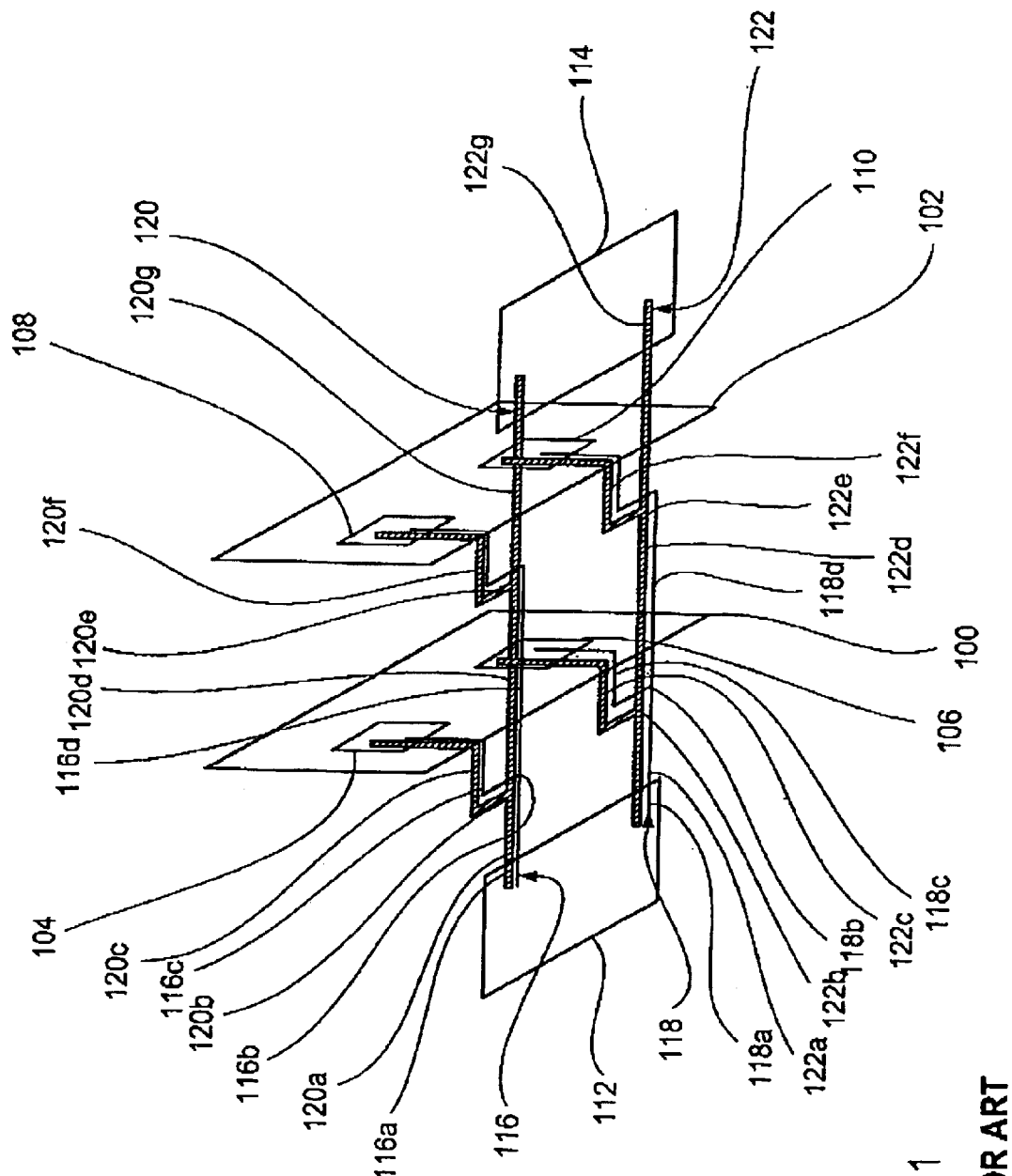
Figure 2:
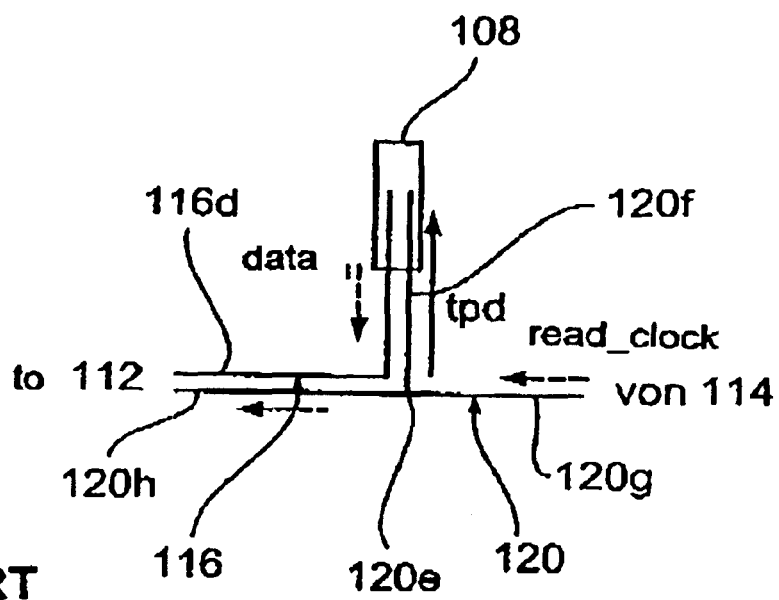
FIG. 2 an enlarged representation of a portion of the memory device shown in FIG. 1 for illustrating the signal run times between a controller and a memory element.

In the following a preferred embodiment will be discussed in more detail with reference to FIG. 4, wherein those elements that have already been described with reference to FIG. 1 are provided with the same reference numbers.

Similar to FIG. 1, the inventive memory device also comprises two memory modules 100 and 102, such as DIMMs, wherein the first memory module 100 comprises a first memory element 104 and a second memory element 106. The second memory module 102 also comprises a first memory element 108 and a second memory element 110. The illustrated memory elements as well as the whole representation in FIG. 4 is only schematically and exemplary, and of course, a memory module comprises in reality a plurality of memory elements. To keep the clarity of the Figure, two memory elements have exemplarily been drawn in the memory modules.

The memory elements 104 to 110 of the memory modules 100, 102 are connected to a controller 112 via a data bus separated into two sub-data buses 116 and 118, to enable the writing of data in the memory elements 104 to 110 and reading data from them, respectively. Similar to FIG. 1, a read clock bus is provided, which is also divided into two sub-buses 120 and 122, wherein the sub-data buses extend from the controller 112 to the memory elements 104 to 110 of the memory modules 100 and 102.

The first sub-data bus 116 comprises a first portion 116a extending from the controller 112 to a branch 116b. A second portion 116c of the first sub-data bus 116 extends from the branch 116b to the first memory element 104 in the first memory module 100. A third portion 116d of the first sub-data bus 116 extends from the branch 116b to the first memory element 108 in the second memory module 102.

The second sub-data bus 118 comprises a first portion 118a extending from the controller 112 to a branch 118b. A second portion 118c of the first sub-data bus 118 extends from the branch 118b to the second memory element 106 in the first memory module 100. A third portion 118d of the second sub-data bus 118 extends from branch 118b to the second memory element 110 in the second memory module 102.

A first portion 120a of the first sub-read clock bus 120 extends from the controller 112 to a first branch 120b. A second portion 120c of the first sub-read clock bus 120 extends from the branch 120b to the first memory element 104 in the first memory module 100. Different to conventional systems, a third portion 120d of the first sub-read clock bus 120 extends directly to the first memory element 106 in the second memory module 102.

A first portion 122a of the second sub-read clock bus 122 extends from the controller 112 to a first branch 122b. A second portion 122c of the second sub-read clock bus 122 extends from the branch 122b to the second memory element 106 in the first memory module 100. Different to conventional systems, a third portion 122d of the second sub-read clock bus 122 extends directly to the second memory element 110 in the second memory module 102.

Figure 4:
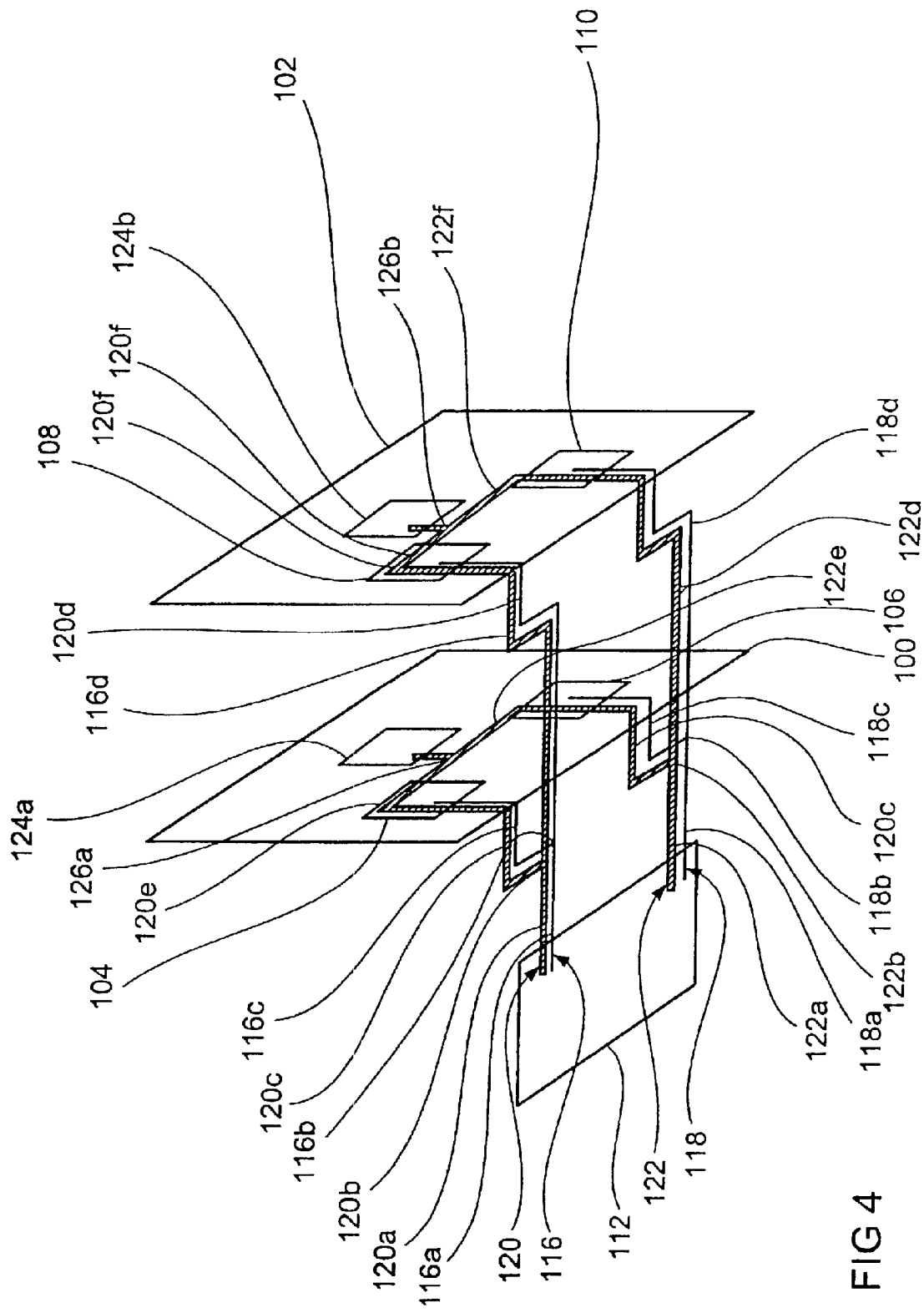
FIG. 4 a schematic representation of a memory device according to a preferred embodiment of the present invention.

Further, the inventive apparatus according to FIG. 4 comprises another read clock bus portion 124a and 124b, respectively, in each memory module 100, 102. The read clock bus extends in each of the memory modules from the memory elements to the read clock generators 124a, 124b. A fourth portion 120e of the read clock bus 120 extends in the first memory module 100 from the second portion 120c of the read clock bus 120 to a common node 126a in the first memory module 100. A fourth portion 122e of the read clock bus 122 extends in the first memory module 100 from the second portion 122c of the read clock bus 122 to the common node 126a in the first memory module 100. The common node 126a in the memory module 100 is connected to the read clock generator 124a in this memory module. A fifth portion 120f of the read clock bus 120 extends in the second memory module 102 from the third portion 122c of the read clock bus 122 to a common node 126b in the second memory module 102. A fifth portion 122f of the read clock bus 122 extends in the second memory module 102 from the third portion 122d of the read clock bus 122 to the common node 126b in the second memory module 102. The common node 126b in the memory module 102 is connected to the read clock generator 124b in this memory module.

In other words, according to the present invention, different to the prior art, a "global" read clock generator is omitted, instead, "local" read clock generators 124a, 124b associated to the individual memory modules 100, 102 are used, which generate the same signals, so that the symmetry of the buses, the data bus and the read clock bus, is matched, as can be seen from a comparison of FIG. 4 with FIG. 1. As can be seen, the buses substantially run in parallel, so that the data and clock signals, respectively, coming from one memory element propagate the same path to the controller.

Figure 5:
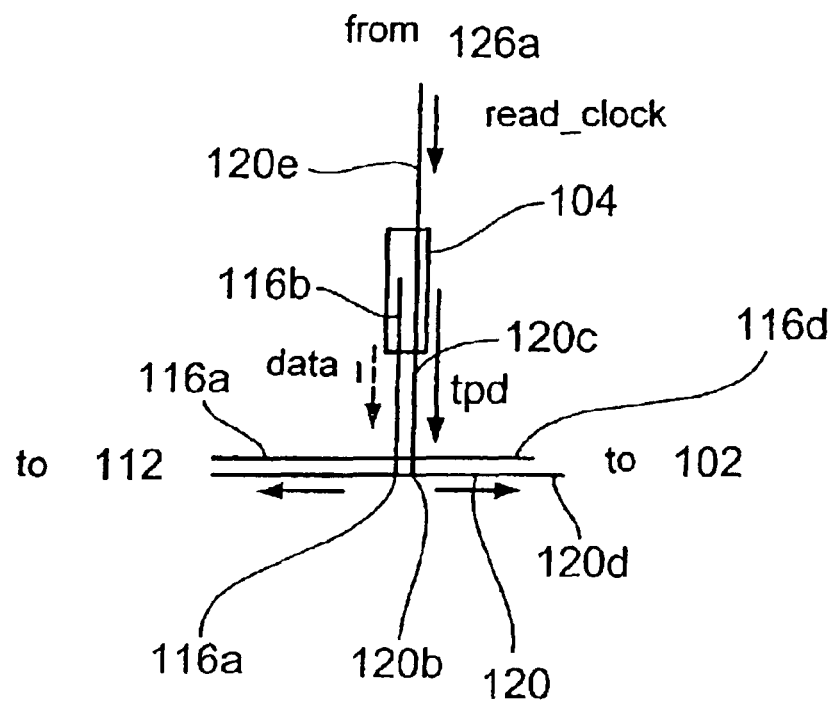
FIG. 5 a portion from the memory device of FIG. 4 for illustrating the signals running on the buses when reading out data from a memory element.

With reference to FIG. 5, the functionality will be discussed in more detail below, with regard to a portion of the memory system shown in FIG. 4. In FIG. 5, a portion of the memory system comprising the memory element 104 is shown exemplarily. Further, the data bus 116 and the read clock bus 120 are shown in part. When reading out data from the memory element 104, the read clock is provided by means 126a via the portion 120e to the memory element 104, so that when reading out, the data on the data bus 116 will be provided substantially concurrently with the read clock signal on the read clock bus 120 and propagate to the controller 112. The run time delays of the read clock signal in the prior art due to the used topology will be reduced and avoided, respectively, by the inventive arrangement of the read clock generators 124a, 124b on the memory modules 100 and 102, respectively, which are associated to the memory elements.

Figure 3:
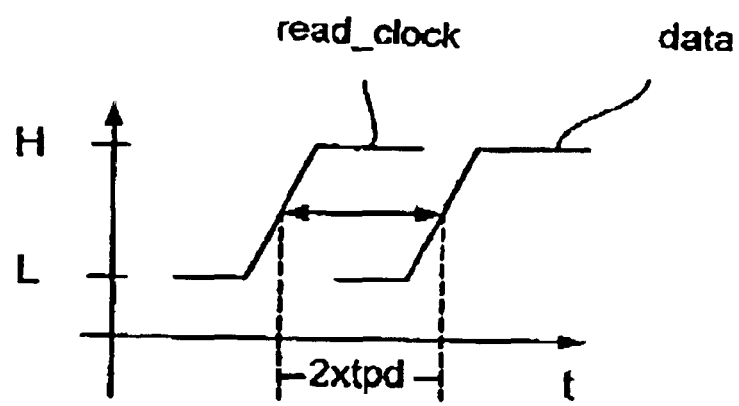
FIG. 3 a graphical representation of the data signals and the read clock signals received at a controller of the system known in the prior art.
Figure 6:
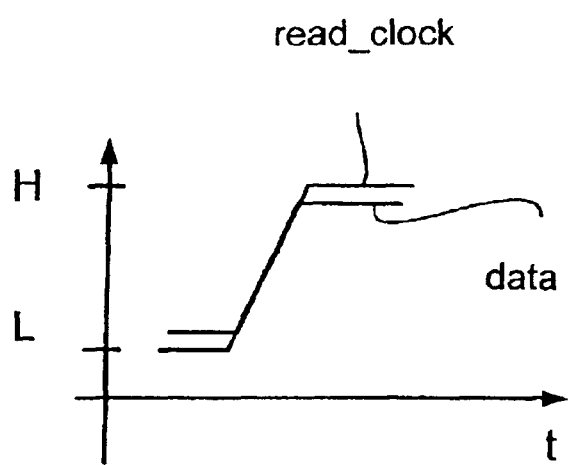
FIG. 6 a graphical representation of the data signals and read clock signals received at a controller of a system according to the present invention.

In FIG. 6, the progress in time of the signals arriving at the controller 112 is shown analogous to FIG. 3. As can be seen, and as a comparison to FIG. 3 shows, hardly any time delay can be recognized between the read data signals and the read clock signals.

Although the present invention has been described with regard to a preferred embodiment, it is naturally not limited to that. Instead of the system shown in FIG. 4, the present invention can also be applied to systems where only one memory module is provided. Also, the present invention can be applied to memory systems with a plurality of memory modules. Also, instead of the illustrated two memory elements in one memory module, a memory module with one or a plurality of memory elements can be provided.

Although it has been described above that the memory modules are DIMMs, other modules can also be used, such as SIMMs (single inline memory modules) or others. Instead of the above-described DRAMs as memory elements, other memory elements can be used as well.

What is claimed is:

1. A memory device, comprising:

a memory module;

a controller;

a data bus connecting the controller and the memory module, to read data from the memory module or write data into the memory module;

means for providing a read clock with which data are transferred from the memory module to the controller; and a read clock bus connecting the means for providing a read clock, the memory module and the controller;

wherein the means for providing a read clock is arranged in the memory module, so that the data bus and the read clock bus are substantially symmetric; and wherein the data bus and the read clock bus are arranged with respect to each other such that substantially no time delay between read data on the data bus and the read clock on the read clock bus exists at the controller.

2. The memory device according to claim 1, wherein the memory module comprises a plurality of memory elements, wherein the data bus comprises a plurality of sub-data buses, wherein the read clock bus comprises a plurality of sub-read clock buses, and wherein a sub-data bits and a sub-read clock bus are associated to each of the memory elements of the memory module.

3. The memory device according to claim 2, wherein the memory elements comprise a DRAM.

4. The memory device according to claim 1, comprising a plurality of memory modules and a plurality of means for generating a read clock, wherein means for providing a read clock are arranged in each memory module, wherein the data bus connects the controller and the plurality of memory modules, and wherein the read clock bus connects the plurality of means for providing a read clock, the plurality of memory modules and the controller.

5. The memory device according to claim 1, wherein the memory module is a DIMM.

* * * * *